United States Patent [19]

Goirand et al.

[11] Patent Number: 4,937,162
[45] Date of Patent: Jun. 26, 1990

[54] METHOD OF OBTAINING RELATIVELY ALIGNED PATTERNS ON TWO OPPOSITE SURFACES OF AN OPAQUE SLICE

[75] Inventors: Pierre Goirand, Caen; Jacques Schneider, Clamart, both, France

[73] Assignee: U.S. Philips Corporation, New York, N.Y.

[21] Appl. No.: 283,409

[22] Filed: Dec. 12, 1988

[30] Foreign Application Priority Data

Dec. 15, 1987 [FR] France ................... 87 17477

[51] Int. Cl.$^5$ ............................................. G03F 9/00
[52] U.S. Cl. ......................................... 430/22; 430/5; 430/311
[58] Field of Search ..................... 430/22, 5, 311

[56] References Cited

U.S. PATENT DOCUMENTS 3,963,489 6/1976 Cho ................................... 430/22

FOREIGN PATENT DOCUMENTS 1060717 4/1956 Fed. Rep. of Germany .

Primary Examiner—Paul R. Michl
Assistant Examiner—Thorl Chea

[57] ABSTRACT

The invention relates to a method of obtaining relatively aligned patterns on two opposite surfaces of an opaque slice (2).

This can be realized in that the opaque slice (2) carrying a reference pattern (3) is glued on a transparent plate (1) on the side of the said pattern (3) and an alignment pattern (8) aligned with respect to the reference pattern (3) is transferred by photolithography to the plate (1). This alignment pattern (8) is used to form on the other surface of the opaque slice (2) the desired patterns (9) aligned with respect to the alignment pattern (8).

6 Claims, 2 Drawing Sheets

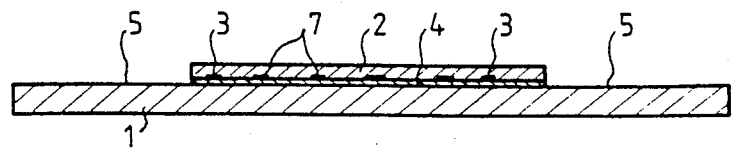
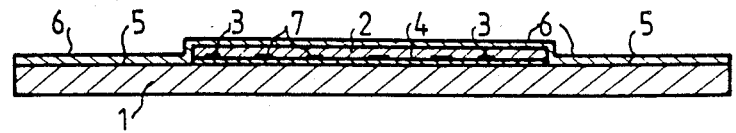
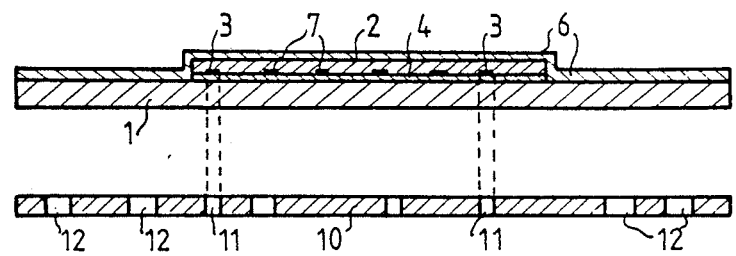
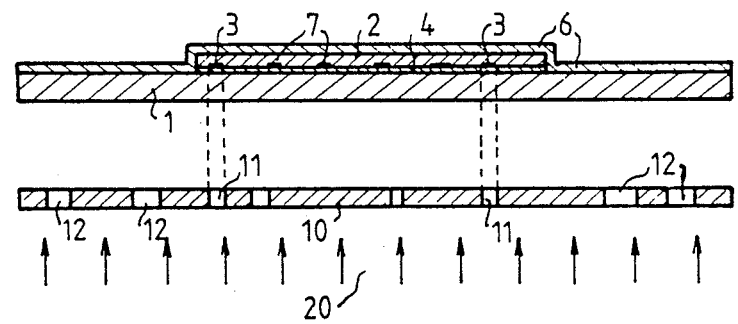
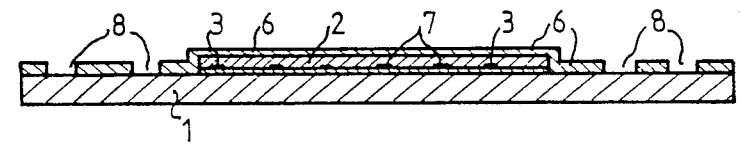
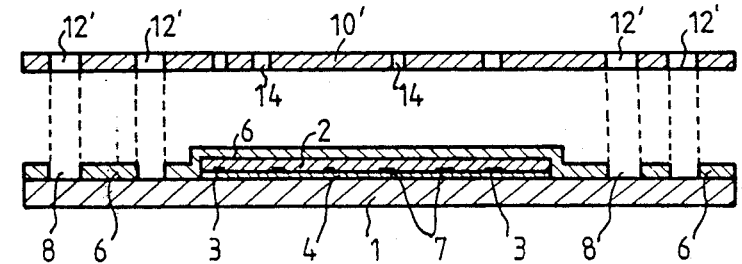

METHOD OF OBTAINING RELATIVELY ALIGNED PATTERNS ON TWO OPPOSITE SURFACES OF AN OPAQUE SLICE

The present invention has for its object a method of obtaining relatively aligned patterns on first and second opposite surfaces of an opaque slice having on the first surface at least one reference pattern.

A technique already known for obtaining such an alignment utilizes a specific machine, by means of which two masks are aligned with respect to each other, the slice being arranged between the two masks and being aligned with respect to one of them.

This technique necessitates the use of an expensive equipment because on the one hand it is specific and on the other hand it is complicated, the machine having to realize a double-face alignment. Moreover, its precision is not really excellent (of the order of $\pm 5$ $\mu$m).

The invention has for its object to provide a method, in which a single-face non-specific machine can be used with a precision at least equal to that of the prior art.

The basic idea of the invention consists in that the opaque slice is glued on a transparent plate on the side of the already existing patterns and to transfer by photolithography patterns aligned with respect to the existing patterns to the transparent plate. These patterns of the glass plate serve in turn as a reference to realize the desired patterns on the other surface of the opaque plate.

For this purpose, the method according to the invention is characterized in that it comprises the following steps:
(a) joining the first surface of the opaque slice to a first surface of the transparent plate having larger dimensions than the opaque slice;
(b) providing a photoresist layer on the second surface of the slice and on the part of the first surface of the transparent plate, which projects from the outline of the opaque slice;
(c) aligning an alignment mask with respect to the reference pattern;
(d) exposing through the alignment mask and the second surface of the transparent plate opposite to its first surface so as to generate an alignment pattern on the photoresist projecting from the outline of the opaque slice;
(e) developing the photoresist exposed during the step (d) so as to cause the alignment pattern to appear;
(f) aligning a realignment mask arranged opposite to the second surface of the slice with the said alignment pattern;
(g) exposing through the realignment mask so as to generate on the photoresist covering the second surface of the slice a functional pattern aligned with respect to the alignment pattern;
(h) developing the photoresist exposed during the step (g) so as to cause the functional pattern to appear.

The opaque slice may be a semiconductor crystal and the transparent plate may consist of glass.

The opaque slice and the transparent plate may be joined together by means of a transparent wax.

In the special case in which the alignment pattern is symmetrical, the alignment mask and the realignment mask are advantageously identical.

According to a preferred embodiment, which permits of obtaining a very high precision of alignment, the alignment and exposure steps are carried out by means of a single-face apparatus operating in projection.

The invention will be understood more clearly when reading the following description given by way of non-limitative example with reference to the drawings, in which:

FIGS. 1a to 1h show the steps of the method according to the invention,

Figure 1G:
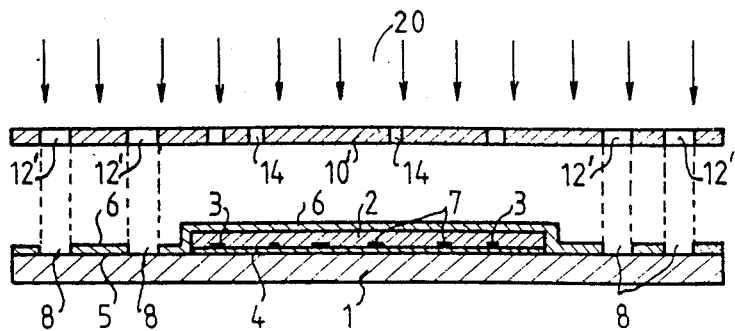

According to FIG. 1a, an opaque slice 2, especially a semiconductor crystal comprising, for example, light-emitting diodes, has on a surface designated as the lower surface a reference pattern 3 and, as the case may be, a pattern of conductive connections 7. The patterns 3 and 7 may consist of semiconductor material, for example in the form of metallic strips or pads.

The opaque slice 2 is glued on the central part of the upper surface of a transparent plate 1 having larger dimensions than the slice 2 so that the transparent plate 1 projects at 5 from the outline of the slice 2. The gluing step is effected by means of a transparent glue layer 4, which permits of subsequently separating the slice 2 from the plate 1, for example a transparent wax.

According to FIG. 1b, a layer of positive photoresist 6 is deposited on the projecting part 5 of the upper surface of the plate 1 and on the upper surface of the slice 2.

According to FIG. 1c, an alignment mask 10 is positioned with respect to the reference pattern 3. This positioning is effected by optically aligning alignment openings 11 of the mask with the reference pattern 3. The alignment mask 10 also comprises openings 12 opposite to the projecting part of the plate 1.

According to FIG. 1d, the mask 10 is exposed by means of a radiation 20 susceptible to inducing a chemical transformation of the photoresist 6 so as to generate an alignment pattern corresponding to the openings 12. This exposure being effected through the lower surface of the covering its upper surface.

According to FIG. 1e, the photoresist 6 is developed so as to cause openings 8 to be formed having the outline of the alignment pattern.

According to FIG. 1f, the openings 12' of a realignment mask 10 arranged on the side of the upper surface of the plate 1 and of the slice 2 are aligned with the openings 9. The realignment mask 10 also comprises openings 14 corresponding to a functional pattern to be formed on the upper surface of the opaque slice 2.

According to FIG. 1g, there is exposed through the upper surface of the slice 2 by means of the radiation 20 so as to generate the desired functional pattern on the photoresist 6 covering the upper surface of the slice 2.

Figure 1H:
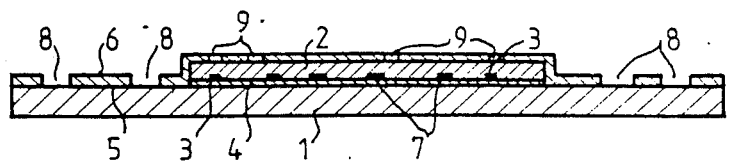

According to FIG. 1h, the photoresist is developed so as to cause openings 9 to be formed corresponding to the desired functional pattern.

Subsequently, it is possible to carry out other steps on the slice 2 so as to utilize the openings 9 of the functional pattern before or after the separation of the opaque slice 2 from the transparent plate 1.

It is particularly advantageous to choose a symmetrical alignment pattern such that it is similar to itself by reversal. In this case, in fact it is possible to use a single mask serving as an alignment and realignment mask. This mask comprises the openings 14 serving to form the openings 9 of the photoresist 6 (FIGS. 1g and 1h).

The existence of these openings 14 of the mask is not disadvantageous because during the step (d) (FIG. 1d) the fact that the slice 2 is opaque prevents any exposure of its upper surface.

Figure 2:
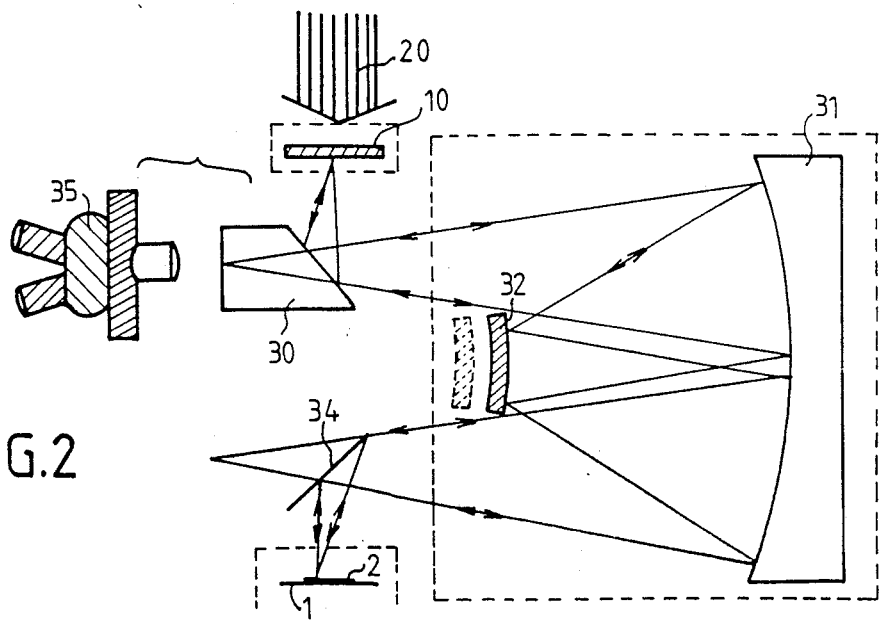
FIG. 2 shows an apparatus of alignment by projection known per se suitable to be used for carrying out the method according to the invention.

According to FIG. 2, a single-face apparatus operating in projection, for example marketed under the designation MICROALIGN III by the Company PERKIN-ELMER, comprises a flat dichroic mirror separating the ultraviolet radiation used for the exposure from the visible radiation used to visualize the alignment of the mask and the slice.

The projection system also comprises a spherical convex mirror 31 constituting a primary mirror, a spherical concave mirror 32 coaxial to the first mirror and displaceable along the said axis and flat mirrors 30, 34.

The radiation 20 exposes the mask 10, whose image is projected onto the slice 2 and the plate 1 successively by the flat mirror 30, the spherical mirrors 31 and 32 and the flat mirror 34, while the alignment obtained by axial displacement of the mirror 32 is controlled by a binocular through the dichroic mirror 30.

The aforementioned apparatus has permitted of obtaining a precision of alignment of the order of ±2 μm.

What is claimed is:

1. A method of obtaining relatively aligned patterns on first and second opposite surfaces of an opaque slice having on the first surface at least one reference pattern, characterized in that
   (a) joining the first surface of the opaque slice to a first surface of the transparent plate having larger dimensions than the opaque slice;
   (b) providing a photoresist layer on the second surface of the slice and on the part of the first surface of the transparent plate, which projects from the outline of the opaque slice;
   (c) aligning an alignment mask with respect to the reference pattern;
   (d) exposing through the alignment mask and the second surface of the transparent plate opposite to its first surface so as to generate an alignment pattern on the photoresist projecting from the outline of the opaque slice;
   (e) developing the photoresist exposed during the step (d) so as to cause the alignment pattern to appear;
   (f) aligning a realignment mask arranged opposite to the second surface of the slice with the said alignment pattern;
   (g) exposing through the realignment mask so as to generate on the photoresist covering the second surface of the slice a functional pattern aligned with respect to the alignment pattern;
   (h) developing the photoresist exposed during the step (g) so as to cause the functional pattern to appear.

2. A method as claimed in claim 1, characterized in that the opaque slice (2) is a semiconductor crystal.

3. A method as claimed in any one of claims 1 and 2, characterized in that the transparent plate (1) consists of glass.

4. A method as claimed in claim 3, characterized in that the opaque slice (2) and the transparent plate are joined together by means of a layer (4) of transparent wax.

5. A method as claimed in claim 4, characterized in that the steps of alignment and exposure are carried out by means of a single-face apparatus operating in projection.

6. A method as claimed in claim 4, characterized in that the alignment pattern (8) is symmetrical, and in that the alignment mask and the realignment mask are identical.

* * * * *